(12) United States Patent
Takano et al.

(10) Patent No.: US 12,407,315 B2
(45) Date of Patent: Sep. 2, 2025

(54) STACKED FILTER PACKAGE HAVING MULTIPLE TYPES OF ACOUSTIC WAVE DEVICES

(71) Applicant: Skyworks Solutions, Inc., Irvine, CA (US)

(72) Inventors: Atsushi Takano, Kadoma (JP); Mitsuhiro Furukawa, Nishinomiya (JP); Takeshi Furusawa, Toyonaka (JP)

(73) Assignee: Skyworks Solutions, Inc., Irvine, CA (US)

( * ) Notice: Subject to any disclaimer, the term of this patent is extended or adjusted under 35 U.S.C. 154(b) by 117 days.

(21) Appl. No.: 18/053,313

(22) Filed: Nov. 7, 2022

(65) Prior Publication Data

US 2023/0142089 A1   May 11, 2023

Related U.S. Application Data

(60) Provisional application No. 63/276,929, filed on Nov. 8, 2021.

(51) Int. Cl.
*H03H 3/02* (2006.01)
*H03H 3/007* (2006.01)
(Continued)

(52) U.S. Cl.
CPC ............. *H03H 3/02* (2013.01); *H03H 3/08* (2013.01); *H03H 9/25* (2013.01); *H03H 9/585* (2013.01);
(Continued)

(58) Field of Classification Search
CPC .......... H03H 3/02; H03H 3/08; H03H 9/1014; H03H 9/25; H03H 9/725; H03H 9/706;
(Continued)

(56) References Cited

U.S. PATENT DOCUMENTS 6,297,580 B1   10/2001   Takayama et al.
6,310,422 B1   10/2001   Satoh et al.
(Continued)

OTHER PUBLICATIONS

Utsumi, Jun. "Direct Bonding of Lithium Tantalate to Silicon at Room Temperature by Using a Self-Sputtered Bonding Method." Japanese Journal of Applied Physics 58.SG (2019): SGGC06—. Web (Year: 2019).*

*Primary Examiner* — Lincoln D Donovan
*Assistant Examiner* — Tyler J Pereny
(74) *Attorney, Agent, or Firm* — Knobbe, Martens, Olson & Bear, LLP

(57) ABSTRACT

A stacked filter package is disclosed. The stacked filter package can include a first acoustic wave device having a first device type. The first acoustic wave device includes a first substrate having a first coefficient of thermal expansion. The stacked filter package can include a second acoustic wave device having a second device type different from the first device type. The second acoustic wave device includes a second substrate having a second coefficient of thermal expansion. The second coefficient of thermal expansion is at least double the first coefficient of thermal expansion. The stacked filter package can include a bonding structure between the first and second substrates. The bonding structure couples the first and second substrate.

20 Claims, 12 Drawing Sheets

(51) Int. Cl.
*H03H 3/08* (2006.01)
*H03H 9/25* (2006.01)
*H03H 9/58* (2006.01)
*H03H 9/64* (2006.01)

(52) U.S. Cl.
CPC .......... *H03H 9/586* (2013.01); *H03H 9/6426* (2013.01); *H03H 9/6489* (2013.01); *H03H 2003/0071* (2013.01)

(58) Field of Classification Search
CPC .... H03H 9/0576; H03H 9/6483; H03H 9/173; H03H 9/059; H03H 9/17; H03H 9/605; H03H 9/171; H03H 9/54; H03H 9/0514; H03H 9/64; H03H 9/175; H03H 9/0523; H03H 9/105; H03H 9/1071; H03H 9/145; H03H 9/568; H03H 9/6489; H03H 9/72; H03H 9/0571; H03H 9/1064; H03H 2003/021; H03H 9/02118; H03H 9/0547; H01L 2924/00012; H01L 2924/181; H01L 2224/16225; H01L 2924/00014; H01L 2224/0401; H01L 2224/13144; H01L 24/05; H01L 24/13; H01L 2924/01029; H01L 2924/01079; H01L 2924/014; H01L 2924/16235; H01L 21/187
See application file for complete search history.

(56) References Cited

U.S. PATENT DOCUMENTS

| | | |
|---|---|---|
| 6,855,637 B2 | 2/2005 | Yamashita et al. |
| 6,937,114 B2 | 8/2005 | Furukawa et al. |
| 7,030,539 B2 | 4/2006 | Furukawa et al. |
| 7,148,769 B2 | 12/2006 | Takano |
| 7,382,081 B2 | 6/2008 | Takano |
| 7,622,684 B2 | 11/2009 | Takano et al. |
| 7,649,235 B2 | 1/2010 | Takano |
| 7,652,214 B2 | 1/2010 | Takano et al. |
| 7,764,007 B2 | 7/2010 | Furukawa et al. |
| 7,982,364 B2 | 7/2011 | Takayama et al. |
| 8,471,433 B2 | 6/2013 | Yamaji et al. |
| 8,564,171 B2 | 10/2013 | Yamaji et al. |
| 9,099,981 B2 | 8/2015 | Furukawa et al. |
| 9,124,239 B2 | 9/2015 | Nakayama et al. |
| 9,325,295 B2 | 4/2016 | Nakayama et al. |
| 9,503,050 B2 | 11/2016 | Hamaoka et al. |
| 10,075,146 B2 | 9/2018 | Hamaoka et al. |
| 10,321,572 B2 | 6/2019 | Takano et al. |
| 10,439,587 B2 | 10/2019 | Takano |
| 10,574,202 B2 | 2/2020 | Takano et al. |
| 10,763,820 B2 | 9/2020 | Takano |
| 10,965,269 B2 | 3/2021 | Takano |
| 10,999,932 B2 | 5/2021 | Takano et al. |
| 11,050,407 B2 | 6/2021 | Takano |
| 11,251,769 B2 | 2/2022 | Takano et al. |
| 11,496,111 B2 | 11/2022 | Takano et al. |
| 11,545,952 B2 | 1/2023 | Takano et al. |
| 11,581,870 B2 | 2/2023 | Takano et al. |
| 11,811,385 B2 | 11/2023 | Takano et al. |
| 2013/0257221 A1 | 10/2013 | Yamaji et al. |
| 2017/0272051 A1* | 9/2017 | Kurihara .............. H03H 9/6483 |
| 2018/0159502 A1 | 6/2018 | Takano |
| 2021/0119607 A1 | 4/2021 | Takano et al. |
| 2021/0119608 A1 | 4/2021 | Takano et al. |
| 2021/0152151 A1 | 5/2021 | Takano et al. |
| 2022/0321081 A1 | 10/2022 | Takano et al. |
| 2022/0321090 A1 | 10/2022 | Takano et al. |
| 2022/0337213 A1 | 10/2022 | Habana et al. |
| 2022/0337217 A1 | 10/2022 | Habana et al. |
| 2023/0104665 A1 | 4/2023 | Takano et al. |
| 2023/0115592 A1 | 4/2023 | Takano et al. |
| 2023/0147060 A1 | 5/2023 | Takano et al. |
| 2024/0039516 A1 | 2/2024 | Goto et al. |
| 2024/0072758 A1 | 2/2024 | Takano et al. |
| 2024/0097640 A1 | 3/2024 | Takano et al. |
| 2024/0113685 A1 | 4/2024 | Wang et al. |

* cited by examiner

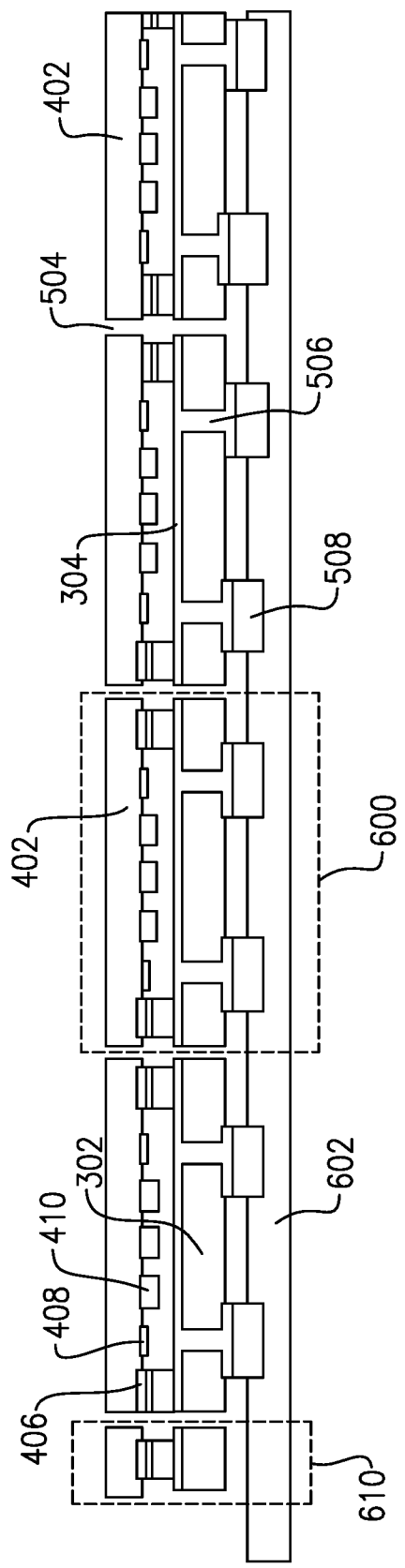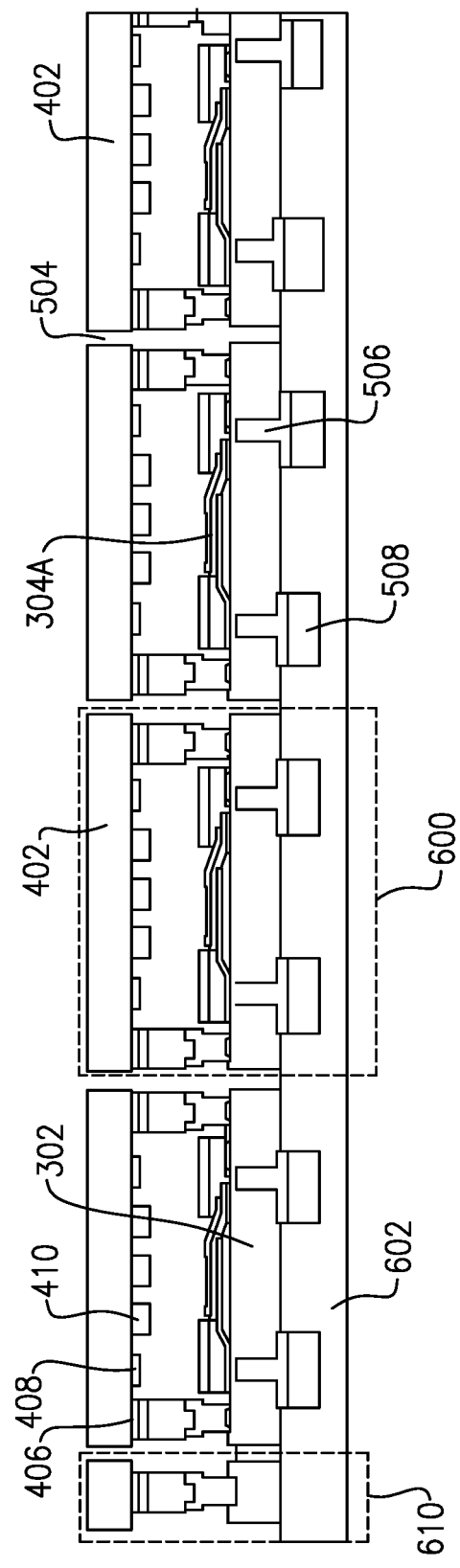

STACKED FILTER PACKAGE HAVING MULTIPLE TYPES OF ACOUSTIC WAVE DEVICES

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application claims the benefit of priority of U.S. Provisional Application No. 63/276,929, filed Nov. 8, 2021, titled "A METHOD FOR FORMING AN ACOUSTIC WAVE DEVICE," the disclosures of which is hereby incorporated by reference in its entirety and for all purposes.

BACKGROUND

Field

The present disclosure generally relates to acoustic wave devices, and particularly to acoustic wave device packages that has different types of resonators or filters, and method of making such packaged devices.

Description of the Related Art

Different types of acoustic wave resonators and filters, such as bulk acoustic wave (BAW) and surface acoustic wave (SAW) resonators/filters, have different advantages and disadvantages arising from their electrical and acoustic properties. Therefore, combining resonator components of different types, such as BAW and SAW structures, may provide improved resonator and filter performances.

However, combining resonator components of different types (e.g., a BAW type and a SAW type) that have separate packages can make the filter structure undesirably bulky.

SUMMARY

The present inventors have appreciated that introducing one or more indentations on at least one of the substrates before the step of bonding may overcome such challenges arising from the CTE mismatch between the substrates.

According to a number of embodiments, the present disclosure relates to a method of forming an acoustic wave device comprising steps of providing (102) a first substrate having a plurality of resonator components of a first type formed thereon; providing (104) a second substrate having a plurality of resonator components of a second type formed thereon; forming (213) a plurality of indentations into the second substrate to reduce rigidity; and bonding (108) the first and second substrates.

Optionally the resonator components of the first type formed on the first substrate may be bulk acoustic wave (BAW) resonators.

Optionally the resonator components of the second type formed on the second substrate may be surface acoustic wave (SAW) resonators.

Optionally each of the first substrate and the second wafer may have a first side and a second side, at least one of the first side of the first substrate and the first side of the second substrate may comprising at least one bonding element.

Optionally at least one material comprising the first substrate and at least one material comprising the substrate may have different coefficients of thermal expansion.

Optionally the at least one indentation may be configured to accommodate stress and/or strain induced by the at least one material comprising the first substrate and the at least one material comprising the second substrate having different coefficients of thermal expansion.

Optionally one or more of the bonding element may comprise a first bonding material and a second bonding material, the first bonding material having a higher melting point than the second bonding material.

Optionally the first bonding material may comprise one or more of gold (Au), copper (Cu) and silver (Ag); and the second bonding material comprises one or more of tin (Sn), indium (In) and lead (Pb).

Optionally the first side of the first substrate and the first side of the second substrate may be positioned to face each other during the step of bonding (106) the first substrate and second substrate.

Optionally at least one of the bonding elements of the first substrate may be positioned to contact at least one of the bonding elements of the second substrate during the step of bonding (106) the first substrate and second substrate.

Optionally the step of bonding (106) the first substrate and second substrate may comprise heating the at least one of the bonding elements.

Optionally the step of bonding (106) the first substrate and second substrate may comprise performing transient liquid phase (TLP) bonding technique on the bonding elements.

Optionally the method of forming the acoustic wave device may comprise a step of dicing (114) the first substrate, second substrate and the components formed thereon to singulate the bonded first substrate and second substrate into at least one individual combined package.

Optionally the step of dicing (114) may be performed by one or more of blade dicing, laser ablation and stealth dicing techniques.

Optionally at least one of the first substrate and second substrate may be mounted on a suspension mechanism prior to the dicing.

Optionally the resonator components of the first type may comprise a piezoelectric layer.

Optionally at least one metal layer may be formed on the first substrate, the at least one metal layer covering at least a part of the first side of the first substrate.

Optionally the first substrate may comprise silicon (Si).

Optionally the metal layer on the first substrate may comprise one or more of copper (Cu) and titanium (Ti).

Optionally the bonding element may be positioned adjacent to the metal layer.

Optionally at least a part of the metal layer may be configured to function as an electrode.

Optionally at least one of the bonding elements on the first side of the first substrate may be configured to function as an electrode.

Optionally the resonator components of the second type may comprise a piezoelectric layer.

Optionally the second substrate may comprise at least one type of piezoelectric material.

Optionally the at least one type of piezoelectric material the second substrate comprises may be one or more of quartz (SiO2), lithium tantalate (LiTaO3) or lithium niobate (LiNbO3).

Optionally the indentations may be formed on at least one of the first side and the second side of the second substrate by using half-cut dicing.

Optionally the half-cut dicing may be performed by one or more of blade dicing, laser ablation and stealth dicing techniques Optionally at least one electrode may be formed on the second substrate.

Optionally at least one of the bonding elements on the second substrate may be configured to function as an electrode.

Optionally the method of forming the acoustic wave device may comprise a step of forming at least one via through the first substrate.

Optionally a first conductive material may be deposited on the second surface of the first substrate to form a conductive layer on the surface of the vias and, optionally, on the second surface of the first substrate.

Optionally the first conductive material may be deposited on the surface of the vias to form at least one vias filled with the first conductive material.

Optionally a second conductive material may be deposited adjacent to the conductive layer to form a plurality of conductive members electrically connected to the conductive layer on the surface of the vias.

According to a number of embodiments, the present disclosure relates to a combined BAW and SAW package, comprising a first substrate having a BAW resonator formed thereon; a second substrate having a SAW resonator formed thereon; and at least one bonding element connecting the first wafer and second wafer.

According to a number of embodiments, the present disclosure relates to a radio frequency (RF) device, comprising a combined BAW and SAW package comprising a first substrate having a BAW resonator formed thereon; a second substrate having a SAW resonator formed thereon; and at least one bonding element connecting the first wafer and second wafer.

According to a number of embodiments, the present disclosure relates to a wireless device, comprising an antenna and a combined BAW and SAW package comprising a first substrate having a BAW resonator formed thereon; a second substrate having a SAW resonator formed thereon; and at least one bonding element connecting the first wafer and second wafer.

In one aspect, a stacked filter package is disclosed. The stacked filter package can include a first acoustic wave device having a first device type. The first acoustic wave device includes a first substrate having a first coefficient of thermal expansion. The stacked filter package can include a second acoustic wave device having a second device type different from the first device type. The second acoustic wave device includes a second substrate having a second coefficient of thermal expansion. The second coefficient of thermal expansion is at least double the first coefficient of thermal expansion. The stacked filter package can include a bonding structure between the first and second substrates. The bonding structure couples the first and second substrate.

In one embodiment, the first acoustic wave device is a bulk acoustic wave filter and the second acoustic wave device is a surface acoustic wave filter. The bulk acoustic wave filter can include a film bulk acoustic wave resonator.

In one embodiment, the second substrate is a lithium tantalate substrate or a lithium niobate substrate.

In one embodiment, the first substrate has an isotropic thermal expansion characteristic and the second substrate has an anisotropic thermal expansion characteristic.

In one embodiment, the first substrate includes a first through via electrically connected to the first acoustic wave device and a second through via electrically connected to the second acoustic wave device. The stacked filter package can further include a pillar. The second acoustic wave device can be electrically connected to the second through via at least partially through the pillar.

In one embodiment, the first substrate, the second substrate, and the bonding structure together define a hermetic cavity. Inner surfaces of the hermetic cavity can consist of inorganic materials. An inner sidewall of the bonding structure that faces the hermetic cavity can be metal plated.

In one aspect, a stacked filter package is disclosed. The stacked filter package can include a bulk acoustic wave device that includes a first substrate. The stacked filter package can include a surface acoustic wave device that is stacked over the bulk acoustic wave device such that a second substrate of the surface acoustic wave device is coupled to the first substrate by way of a bonding structure.

In one embodiment, the first substrate is a silicon substrate. The second substrate can be a lithium tantalate substrate or a lithium niobate substrate.

In one embodiment, the first substrate includes a first through via electrically connected to the bulk acoustic wave device and a second through via electrically connected to the surface acoustic wave device at least partially through a pillar.

In one aspect, a stacked filter package is disclosed. The stacked filter package can include a first acoustic wave device having a first device type. The first filter includes a first substrate. The stacked filter package can include a second acoustic wave device having a second device type different from the first device type. The second filter includes a second substrate. The stacked filter package can include a hermetic cavity between the first substrate and the second substrate.

In one embodiment, the first acoustic wave device is a bulk acoustic wave filter and the second acoustic wave device is a surface acoustic wave filter. The bulk acoustic wave filter can include a film bulk acoustic wave resonator.

In one embodiment, the second substrate is a lithium tantalate substrate or a lithium niobate substrate.

In one embodiment, the stacked filter package further includes a bonding structure between the first and second substrates. The first substrate, second substrate, and the bonding structure together can define the hermetic cavity. Inner surfaces of the hermetic cavity can consist of inorganic materials.

Embodiments disclosed herein may address various problems. One or more embodiments may address one or more of the problems concerning fabricating and/or packaging an acoustic wave device comprising two or more connected parts, such as substrates connected via bonding elements, having different coefficients of thermal expansion (CTE) and damage induced by the CET mismatch, particularly when the fabrication and/or packaging process involves applying heat to at least one of the substrates, or other problems concerning packaging of an acoustic wave device having a plurality of acoustic wave components, such as BAW and SAW resonators and filters.

The present disclosure relates to U.S. patent application Ser. No. 18/053,321, titled "METHOD FOR FORMING ACOUSTIC WAVE DEVICE," filed on Nov. 7, 2022, the entire disclosure of which are hereby incorporated by reference herein.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure.

FIG. 6A is a simplified cross-sectional view of singulated individual combined acoustic wave device packages, each of the singulated individual combined acoustic wave device packages comprising a BAW resonator and a SAW resonator according to an embodiment.

FIG. 6B is a detailed simplified cross-sectional view of singulated individual combined acoustic wave device packages, each of the singulated individual combined acoustic wave device packages comprising a BAW resonator and a SAW resonator according to an embodiment.

DETAILED DESCRIPTION

Figure 1:
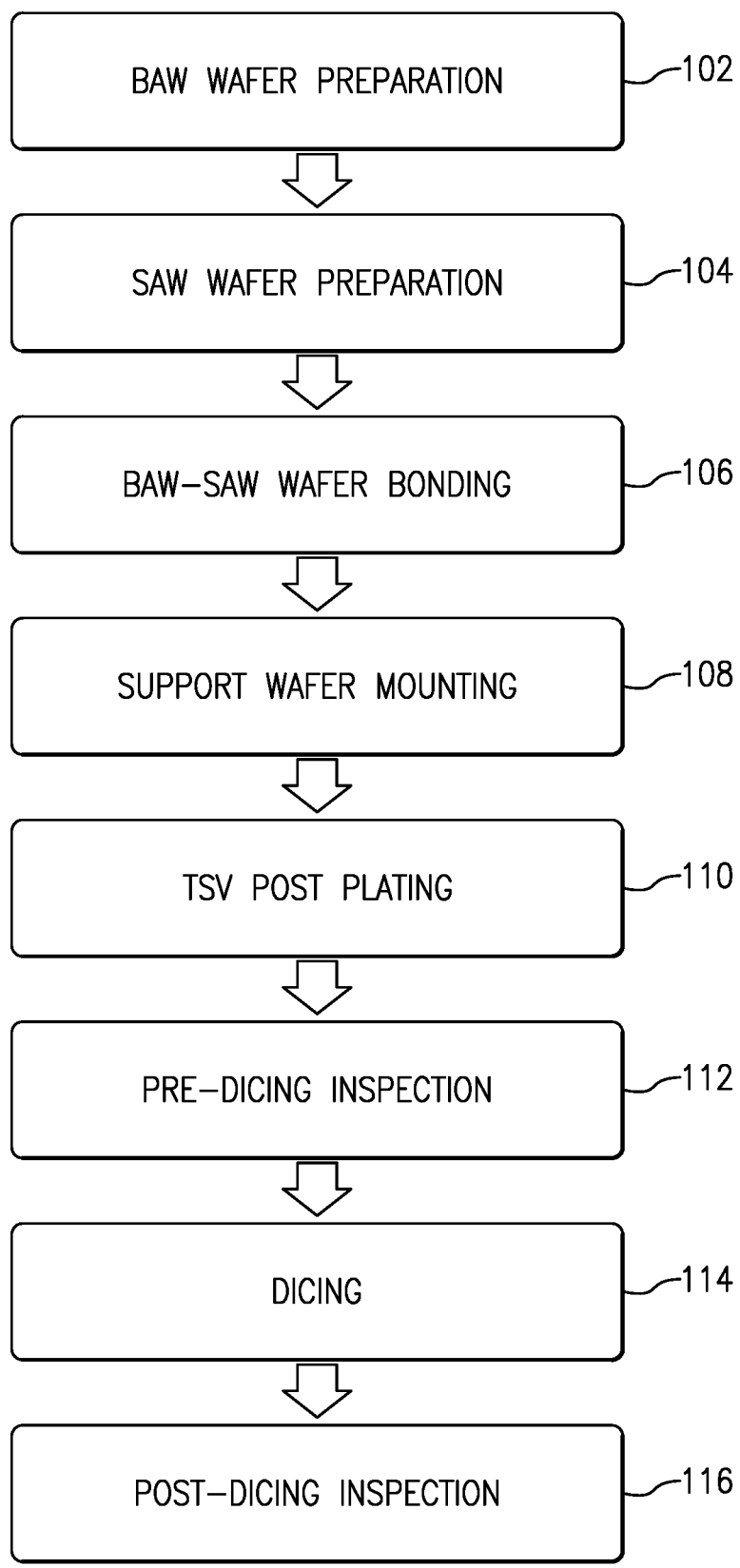
FIG. 1 is a process flow diagram showing steps for forming an acoustic wave device according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

One solution to reduce a size of a hybrid filter that includes multiple types of filters (e.g., a BAW filter and a SAW filter) is to combine the resonator component structures in a single package. One of the steps for combining these structures, such as BAW and SAW structures, in a single package is a step of bonding substrates having the relevant components formed thereon. However, the present inventors have appreciated that due to the large difference in coefficients of thermal expansion (CTE) of commonly used substrate materials used for different resonator structures, such as BAW and SAW structures, bonding the substrates, which typically involve heating the substrates, can be challenging.

Generally, embodiments of the present disclosure may provide a method of forming an acoustic wave device that includes a first substrate having resonator components of a first type, such as BAW resonators, formed thereon, a second substrate having resonator components of a second type, such as SAW resonators, formed thereon, and at least one bonding element connecting the first substrate and second substrate. A corresponding combined acoustic wave device package and components comprising such acoustic wave device package are also provided.

The expressions "providing a first/second substrate" and "preparing a first/second substrate" may be used interchangeably for the purpose of the following discussion. The terms "substrate" and "wafer" may be used interchangeably for the purpose of the following discussion.

Different types of acoustic wave devices, such as resonators or filters, can have different physical structures. For example, the different types of acoustic wave devices can include a BAW device and a SAW device. A film bulk acoustic wave resonator (FBAR) and a solidly mounted resonator (SMR) are examples of the BAW device. For example, a FBAR can include a substrate, a lower electrode over the substrate, an upper electrode, a piezoelectric layer between the lower and upper electrodes, and a cavity between the substrate and the lower electrode. The substrate of the FBAR can typically be a silicon substrate. A temperature compensated SAW device and a multilayer piezoelectric substrate (MPS) SAW device are examples of the SAW device. For example, a SAW device can include a piezoelectric substrate and an interdigital transducer electrode over the piezoelectric layer. The piezoelectric layer can typically be a lithium tantalate (LT) substrate or a lithium niobate (LN) substrate. When the BAW device and the SAW device are stacked and bonded to one another, a bonding element can be provided between the two devices. A bonding process can include heating (e.g., annealing) the stacked structure to a relatively high temperature, such as over 200° C., 235° C., 250° C., 300° C., 350° C. or even higher depending at least in part on a material used for bonding the two resonators. A difference in the coefficient of thermal expansion (CTE) of the substrate of the BAW device and the CTE of the SAW device may damage the stacked structure during the bonding process. For example, the heating process of the bonding process can crack a portion of the stacked structure, such as the piezoelectric substrate of the SAW device.

Various embodiments disclosed herein relate to methods of forming the stacked structure (e.g., a stacked filter package) that includes a first type acoustic wave device (e.g., a BAW device) and a second type acoustic wave device (e.g., a SAW device) that can mitigate or reduce the chance of damaging the stacked structure during a bonding process. In some embodiments, a method of forming the stacked structure can include forming one or more slits (e.g., indentations) through at least a portion of a piezoelectric substrate of the SAW resonator.

A cavity can be formed in the stacked structure between a first type acoustic wave device (e.g., a BAW device) and a second type acoustic wave device (e.g., SAW device). In certain arrangements, the stacked structure may be sensitive to moisture and a relatively high humidity. For example, moisture can negatively affect the performance of the stacked structure when water reaches an electrode of the BAW device.

Various embodiments disclosed herein relate to stacked structures (e.g., stacked filter packages) that includes multiple acoustic wave device types. In some embodiments, the stacked structure can include a hermetic cavity between a first type acoustic wave device and a second type acoustic wave device. For example, the first acoustic wave device can be a BAW device and the second acoustic wave deice can be a SAW device. The first and second acoustic wave devices can be bonded to one another by way of a bonding element. The bonding element can function as a seal ring such that when the first and second acoustic wave devices are bonded the bonding element, the first acoustic wave device, and the second acoustic wave device together define the hermetic cavity.

FIG. 1 is a process flow diagram showing exemplary steps for forming an acoustic wave device (600) comprising a first substrate (302) having resonator components (304A) of a first type formed thereon, a second substrate (402) having resonator components of a second type formed thereon, and at least one bonding element (306, 308) connecting the first substrate (302) and second substrate (402) (see FIG. 6B). FIG. 2 is a detailed process flow diagram showing detailed exemplary steps for forming the acoustic wave device (600). The steps for forming the acoustic wave device (600), as shown in FIG. 1 and FIG. 2, comprises steps for providing (102) the first substrate (302), providing (104) the second substrate (402), forming (213) a plurality of indentations (404) into the second substrate (402) to reduce rigidity, and bonding (106) the first substrate (302) and the second substrate (402).

As shown in FIG. 1, forming the acoustic wave device (600) may also involve one or more of optional steps, such as mounting (108) one or more of the substrates (302, 402) on one or more support wafer(s); forming (110) one or more vias (506) having one or more conductive material(s) (506, 508) deposited thereon; dicing (114) the first substrate (302) and second substrate (402) to singulate the bonded first substrate and second substrate (500) into at least one individual combined package (600); and inspection (112, 116) before and/or after the step of dicing (114).

As shown in FIG. 1 and FIG. 2, and will be discussed with reference to exemplary cross-sectional side views of FIG. 3A to FIG. 6B, the first substrate (302) may be a BAW substrate (302) having BAW resonators (304A) formed thereon, and the second substrate (402) may be a SAW substrate (402) having SAW resonators formed thereon.

However, the first substrate (302) and the second substrate (402) may be any suitable substrates (302, 402) having resonator components of any suitable types formed thereon in accordance with any suitable principles and advantages discussed herein. For example, the first substrate (302) and/or the second substrate (402) may comprise one or more of: Si, glass, LiNbO$_3$ and LiTaO$_3$, and the first substrate (302) and/or the second substrate (402) may have one or more of: BAW, SAW and integrated passive devices (IPDs) or integrated passive components (IPCs) formed thereon. Accordingly, alongside the combinations of the first and second substrates (302, 402) described herein, suitable combinations of first and second substrates (302, 402) may also include: a Si substrate having one or more BAW resonator components formed thereon and a glass substrate having one or more IPDs or IPCs formed thereon; a LiNbO$_3$ or LiTaO$_3$ substrate having one or more SAW resonator components formed thereon and a Si substrate having one or more IPDs or IPCs formed thereon; and a LiNbO$_3$ or LiTaO$_3$ substrate having one or more SAW resonator components formed thereon and a glass substrate having one or more IPDs or IPCs formed thereon.

Similarly, as shown in FIG. 1 and FIG. 2, and will be discussed with reference to exemplary cross-sectional side views of FIG. 3A to FIG. 6B, the step of forming (213) a plurality of indentations (404) into the second substrate (402) may be performed by using half-cut dicing technique (213), and the step of bonding (108) the first substrate (302) and the second substrate (402) may be performed by using transient liquid phase (TLP) bonding technique. However, the step of forming (213) a plurality of indentations (404) and the step of bonding (108) the first substrate (302) and the second substrate (402) may be performed by any suitable techniques in accordance with any suitable principles and advantages discussed herein.

A method of forming a stacked structure, such as a stacked filter package, according to some embodiments can include providing a first acoustic wave device, providing a second acoustic wave device, forming a slit (e.g., an indentation) at least partially through a portion of a substrate of the second acoustic wave device, and bonding the first and second acoustic wave devices. Providing the first and second acoustic wave devices can include forming the first and second acoustic wave devices, and preparing the first and second acoustic wave devices for bonding.

Figure 2A:
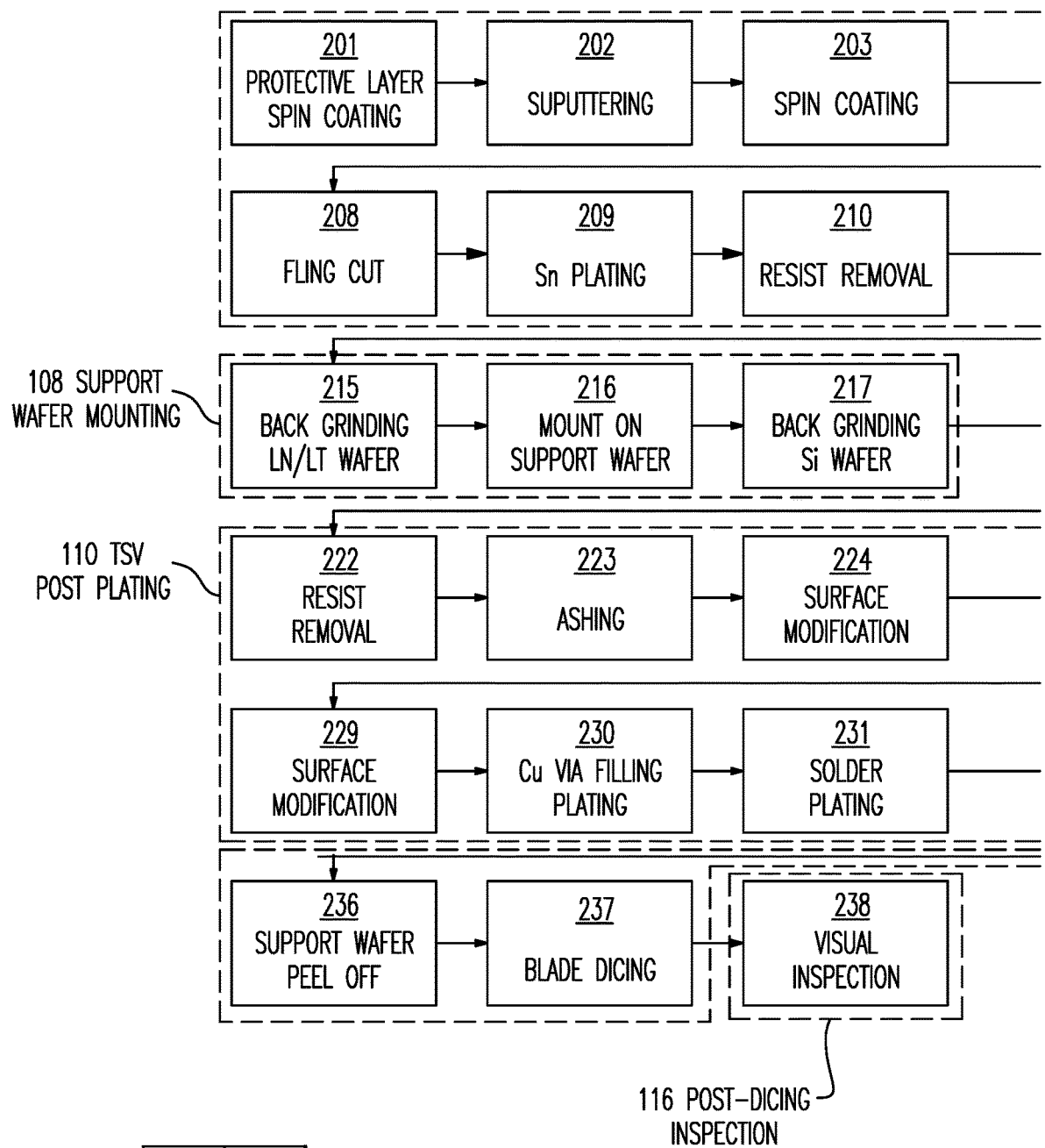
FIG. 2 (provided in two parts, FIGS. 2A and 2B, which are provided on separate sheets) is a detailed process flow diagram showing detailed steps for forming an acoustic wave device according to an embodiment.
Figure 2B:
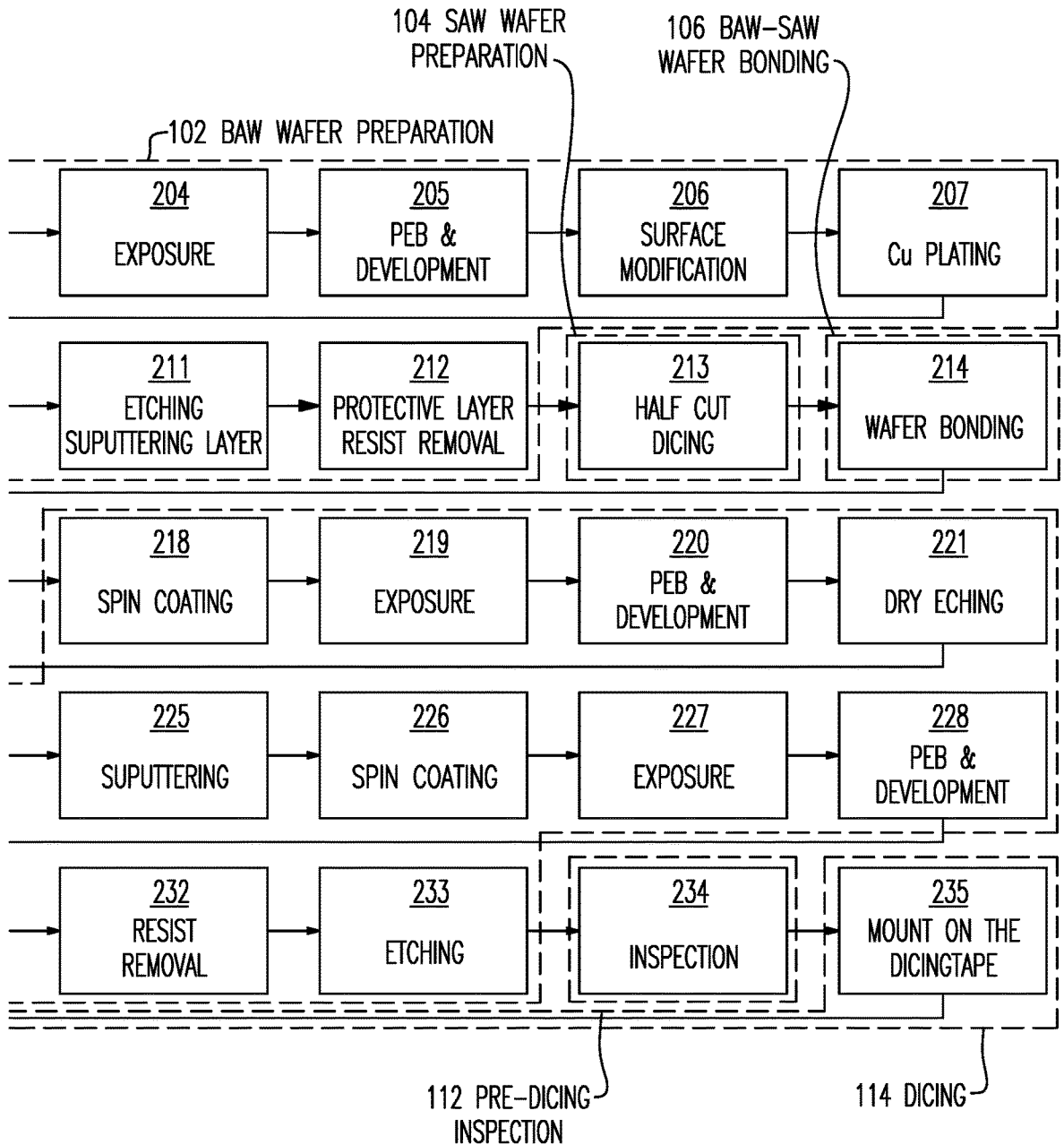

Preparing the first acoustic wave device (e.g., a BAW resonator) for bonding can include, referring to FIGS. 2A and 2B, coating 201 (e.g., spin coating) a protective layer over a substrate, sputtering 202 over a surface of the protective layer to form a sputtering layer, coating 203 a resist layer, exposing 204 a light to remove at least a portion of the resist layer, post-exposure baking (PEB) and developing 205 the exposed resist layer, modifying 206 a surface of the resist layer, plating 207 a metal (e.g., copper (Cu)) in an opening formed in the resist layer, filling the opening or a cut, plating 209 a metal (e.g., tin (Sn)) over the filled portion, removing 210 the resist layer, etching 211 the sputtering layer, and removing 212 the protective layer. Preparing the second acoustic wave device (e.g., a SAW resonator) for bonding can include, referring to FIGS. 2A and 2B, forming a slit (e.g., half cutting 213) a substrate of the second acoustic wave device. The half cutting 213 is an example forming a CTE difference compensating structure, such as a slit or indentation in the substrate of the second acoustic wave device. After the first and second acoustic wave devices are prepared for bonding, the first and second acoustic wave devices can be bonded to one another by bonding 214.

The method of forming the stacked structure can include back grinding the substrate (e.g., a lithium tantalate substrate or a lithium niobate substrate) of the second acoustic wave device, mounting 216 the bonded first and second acoustic wave devices to a support wafer, and back grinding 217 the substrate (e.g., a silicon substrate) of the first acoustic wave device. The method of forming the stacked structure can include forming 110 one or more through silicon vias (TSVs). Forming 110 the TSVs can include coating 218 (e.g., spin coating) a resist layer on the substrate of the first acoustic wave device, exposing 219 light to the resist layer, post-exposure baking (PEB) and developing 220 the exposed resist layer, etching (e.g., dry etching) 221 at least a portion of the substrate of the first acoustic wave device to define one or more openings, removing 222 the resist layer, ashing 223 the surface of the substrate of the first acoustic wave device, modifying 224 the surface of the substrate of the first acoustic wave device, sputtering 225, coating 226 (e.g., spin coating), exposing 227, post-exposure baking (PEB) and developing 228, and modifying 229 a surface of the substrate of the post-exposure baking (PEB) and developing 220 in preparation for via filling, filling 230 the one or more openings with metal (e.g., copper (Cu)), plating 231 solder, removing 232 the resist layer, and etching 233 unwanted materials. The method of forming the stacked structure can include inspecting 234, mounting 235 the bonded first and second acoustic wave devices on a dicing tape, removing (e.g., peeling) 236 the support wafer, dicing (e.g., blade dicing) 237, and inspecting 238 the diced structures.

Figure 3A:
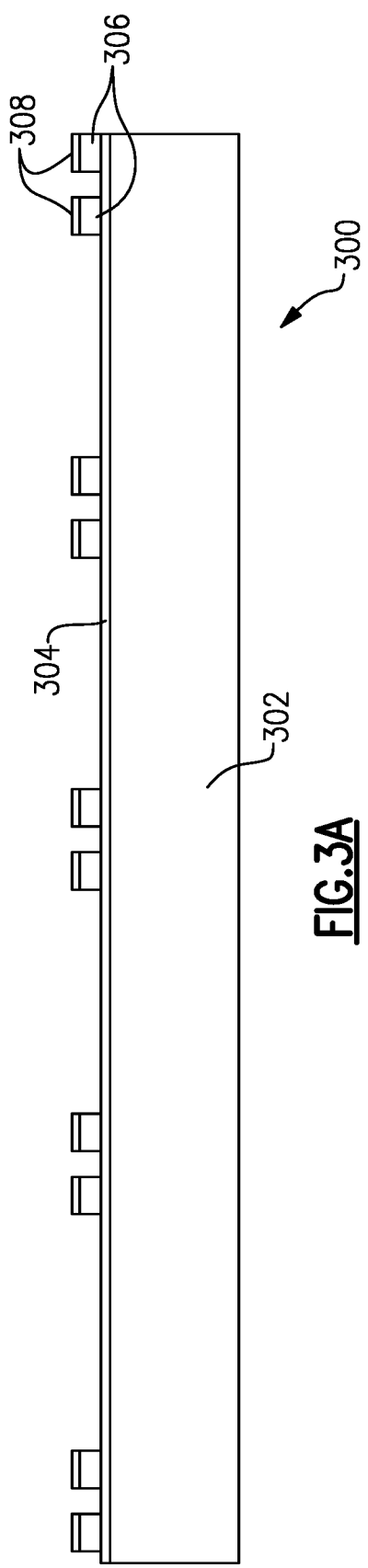
FIG. 3A is a simplified cross-sectional view of a first substrate having BAW resonators formed thereon according to an embodiment.
Figure 3B:
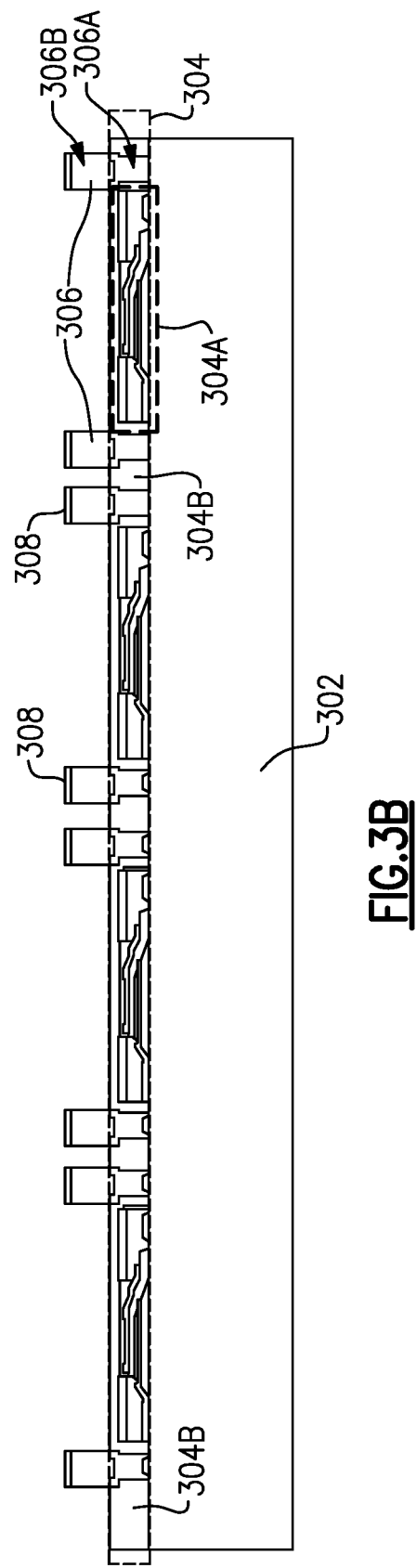
FIG. 3B is a detailed cross-sectional view of a first substrate having BAW resonators and photoresist formed thereon according to an embodiment.

FIG. 3A shows the first substrate (302) provided in the step of providing (102) the first substrate (302). The first substrate (302) may have a layer (304) having a plurality of resonator components (304A) of a first type formed thereon. For example, as illustrated in FIG. 3B, the resonator components (304A) of the first type may be BAW resonators. The first substrate (302) may also comprise one or more bonding elements (306, 308) on a first side. At least one of the bonding element(s) (306, 308) may be configured to function as an electrode. The resonator components (304A) of a first type and the bonding elements (306, 308) may be on the same side of the first substrate (302). The first substrate (302) may comprise silicon (Si). The first substrate 302 can have an isotropic thermal expansion characteristic. The first substrate (302) may have at least one metal layer covering at least a part of the first side. The metal layer(s) may comprise one or more of copper (Cu) and titanium (Ti). At least one of the metal layer(s) may be configured to function as an electrode. The resonator components (304A) of a first type may comprise a piezoelectric layer.

Each of the bonding elements (306, 308) may comprise a plurality of bonding materials (306, 308) having different melting points. For example, as shown in FIG. 3A and FIG. 3B each of the bonding elements (306, 308) may comprise a first bonding material (306) and a second bonding material (308). In such cases, the first bonding material (306) may have a higher melting point than the second bonding material (308). Optionally, at least one of the bonding materials may be thermally and/or electrically conductive. For example, the first bonding material may comprise one or more of: gold (Au), copper (Cu) and silver (Ag), and the second bonding material may comprise one or more of: tin (Sn), indium (In) and lead (Pb).

Each of the bonding materials may form a separate layer within each of the bonding element (306, 308). In such cases, the bonding material having the lowest melting point, the second bonding material in the examples shown in FIG. 3A and FIG. 3B, may have a smaller thickness than the bonding material having the highest melting point, the first bonding material in the examples shown in FIG. 3A and FIG. 3B. The bonding material having the lowest melting point, the second bonding material in the examples shown in FIG. 3A and FIG. 3B, may be located between the first substrate (302) and the bonding material having the highest melting point, the first bonding material in the examples shown in FIG. 3A and FIG. 3B.

Alternatively, the plurality of bonding materials (306, 308) may form one or more compound(s) within the bonding element (306, 308).

The bonding elements (306, 308) may be deposited using any suitable deposition techniques, such as sputtering, thermal evaporation, and e-beam evaporation. Different deposition techniques may be used for different bonding materials (306, 308). In order to form the bonding elements (306, 308) at desired positions on the first substrate (302), one or more patterning technique(s), such as photolithography, shadow masking, micro- and nano-imprinting, may be used prior to deposition of the bonding elements (306, 308). The bonding elements (306, 308) may be deposited directly on the first substrate (302). Alternatively, the bonding elements (306, 308) may be deposited on one or more of the metal layer(s) positioned on the first substrate and/or one or more of the resonator components (304A) of the first type.

Figure 3C:
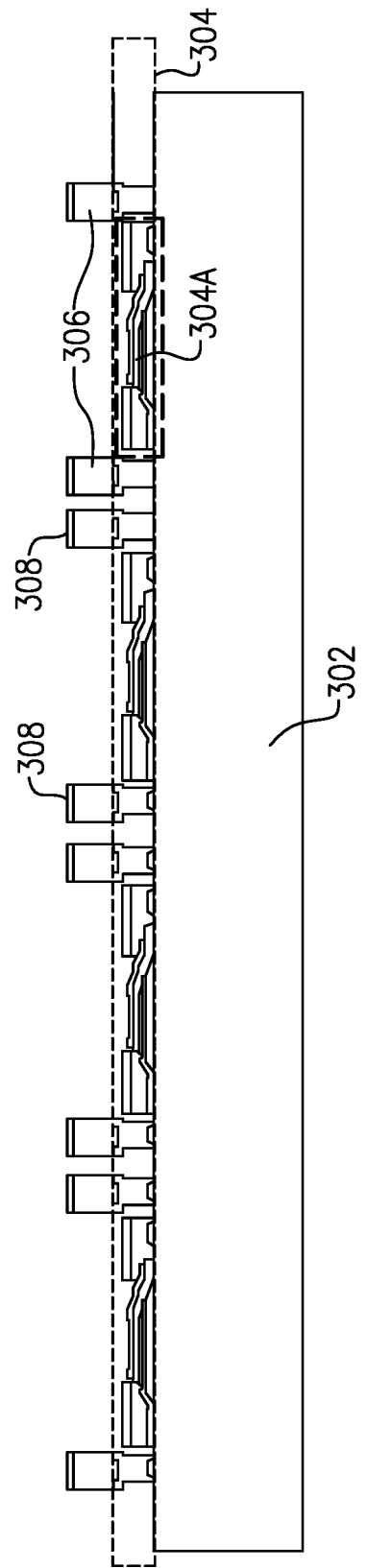
FIG. 3C is a detailed cross-sectional view of a first substrate having BAW resonators formed thereon after photoresist removal according to an embodiment.

When the step of forming the bonding elements (306, 308) involves photolithography which involves coating a surface of the first substrate (302) with a photoresist, the resonator components (304A) of the first type may be mounted on the first substrate (302) prior to coating the surface of the first substrate (302). In such cases, the photoresist (304B) may also cover surfaces of the resonator components (304A) of the first type, as shown in FIG. 3B. In view of device performances and following fabrication steps, having a photoresist material on the surfaces of the first substrate (302) and/or the resonator components (304A) of the first type may not be desirable. In such cases, the photoresist layer may be removed as shown in FIG. 3C.

In some embodiments, the bonding element 306 can have a first portion 306a and a second portion 306b. The first portion 306a and the second portion 306b can be separately formed. In some embodiments, the first portion 306a and the second portion 306b may have different widths and defines a stepped structure. For example, a width of the first portion 306a can be narrower than or wider than a width of the second portion 306b. The different widths between the first portion 306a and the second portion 306b can be an artifact of the process of forming the bonding element 306. In some embodiments, a height of the first portion 306a can be greater than a height of the resonator component 304A.

Figure 4:
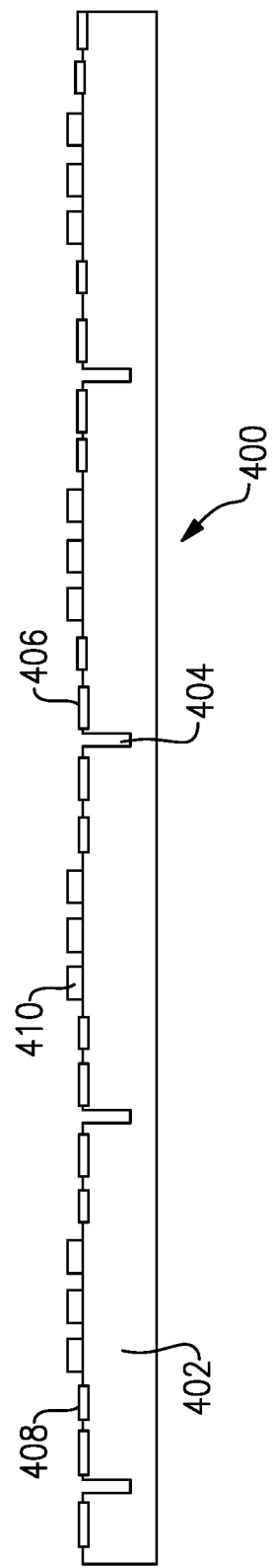
FIG. 4 is a detailed cross-sectional view of a second substrate having SAW resonators formed thereon after photoresist removal according to an embodiment.

FIG. 4 shows the second substrate (402) provided in the step of providing (104) the second substrate (402). The second substrate (402) may comprise at least one type of piezoelectric material, and in particular this may be in the form of a piezoelectric layer. The piezoelectric material of the second substrate (402) may be one or more of quartz ($SiO_2$), lithium tantalate ($LiTaO_3$) and lithium niobate ($LiNbO_3$). The second substrate 402 can have an anisotropic thermal expansion characteristic. The second substrate (402) may also comprise one or more bonding elements (406) on a first side. At least one of the bonding element(s) (406) may be configured to function as an electrode. The second substrate (402) may have at least one metal layer (408, 410) covering at least a part of the first side. The metal layer(s) (408, 410) may be located on the first side of the second substrate (402).

The surface of the first side of the second substrate (402) and the metal layer(s) (408, 410) may form at least one resonator component of a second type, such as SAW resonators as illustrated in FIG. 4. In such cases, the metal layer(s) (408, 410) may form at least a set of two interlocking comb-shaped arrays of metallic electrodes, such as an interdigital transducer (IDT), for converting SAWs to electric signals and/or electric signals to SAWs.

As illustrated in FIG. 4, the second substrate (402) may comprise at least one indentation (404) or slit on at least one of the first side and a second side of the second substrate (402). The indentation(s) 404 may be formed by making one or more half-cut(s) on the first and/or the second side(s) of the second substrate (402). The term "half-cut(s)" may be used to indicate indentation(s) or cut(s) having a depth that is smaller than a total thickness of a substrate and/or layer(s) on/through which the cut(s) are made. The term "half-cut(s)" is not used to suggest that the depth of the cut(s) needs to be equal or close to half of the total thickness of the substrate and/or layer(s) on/through which the cut(s) are made. The half-cut(s) may be made by using any suitable techniques for forming indentation(s) on the second substrate (402), such as blade dicing, laser ablation, and stealth dicing techniques.

When the second substrate (402) comprises a plurality of resonator components of the second type, such as SAW resonators, the indentations (404) may be made in a manner that each area of the second substrate (402) defined by the indentations (404) includes one resonator component of the second type. The size of each area of the second substrate (402) defined by the indentations (404) may be approximately equal to the size of the resonator component of the first type on the first substrate (302).

The first substrate (302) and the second substrate (402) may comprise different materials. For example, as illustrated in the examples shown in FIGS. 3A-3C, and 4, the first substrate (302) may be a silicon substrate supporting at least one BAW resonator(s) whereas the second substrate (402) may be a piezoelectric substrate such as a substrate comprising one of more of quartz ($SiO_2$), lithium tantalate ($LiTaO_3$) and lithium niobate ($LiNbO_3$). In such cases, the first substrate (302) and the second substrate (402) will have different coefficients of thermal expansion (CTE). This means that when the first substrate (302) and the second substrate (402) undergo a significant and/or sudden change of temperature after being bonded together and/or during a bonding process, their different rates of expansion and/or contraction may lead to structural damage(s) such as a crack, warpage, and bow.

As bonding techniques used for wafer-to-wafer bonding, such as TLP bonding, typically involve heating at least a part of the wafer(s) followed by cooling, bonding two wafers having different CTEs can be challenging. However, the present inventors have appreciated that introducing indentation(s) (404) on at least one side of at least one of the two substrates being bonded may overcome such challenges arising from the CTE mismatch between the two substrates. In some embodiments, the indentations 404 may be formed with a substrate that has a greater CTE than the other substrate. This may be because the substrate(s) having such indentation(s) (404) have reduced rigidity and, therefore, can better accommodate stress and/or strain induced by the CTE mismatch between the two substrates. Furthermore, the indentations (404) may also be used for singulating the substrate into individual components or devices at later stage of fabrication. Such singulation may, for example, be performed by grinding the substrate from a side of the substrate having no indentation towards a side of the substrate having indentations (404). Alternatively, such singulation may be performed by cleaving the substrate along the lines defined by the indentations (404). In the examples discussed below, the indentations are on the first side of the second substrate (402).

Figure 5A:
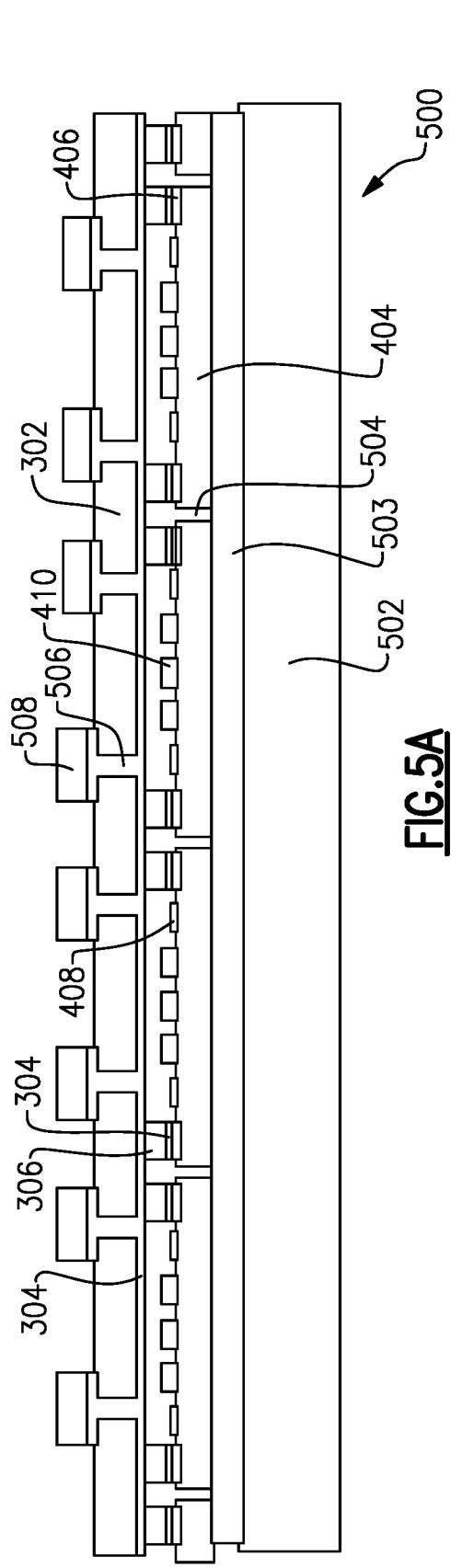
FIG. 5A is a simplified cross-sectional view of a combined acoustic wave device package comprising BAW resonators and SAW resonators according to an embodiment.
Figure 5B:
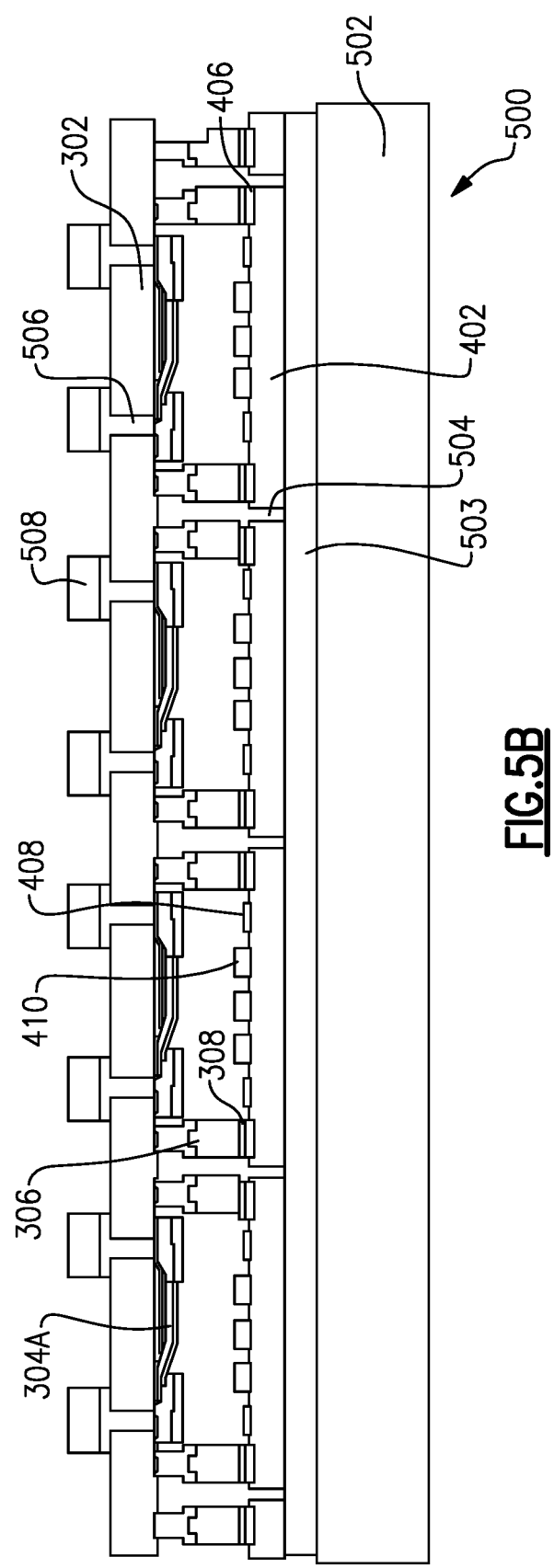
FIG. 5B is a detailed simplified cross-sectional view of a combined acoustic wave device package comprising BAW resonators and SAW resonators according to an embodiment.

Prior to the step of bonding (106), each of the resonator components of the second type may be aligned to approximately overlap with one of the resonator components of the first type (304A) on the first substrate (302), as shown in FIGS. 5A and 5B. The first substrate (302) the second substrate (402) may be positioned in a way that the first side of the first substrate (302) and the first side of the second substrate (402) are facing each other during the step of bonding (106). This enables at least one of the bonding elements (306, 308) of the first substrate (302) to contact at least one of the bonding elements (406) of the second substrate during the step of bonding (106). Alternatively, at least one of the bonding elements (306, 308) of the first substrate (302) may contact the second substrate (402) or one or more components formed thereon, such as the metal layer(s) (408, 410). Alternatively, at least one of the bonding elements (406) of the second substrate may contact the first substrate (302) or one or more components formed thereon, such as the resonator components (304A) of the first type or the metal layer(s).

The step of bonding (106) the first substrate (302) and second substrate (402) may comprise heating at least one of the bonding elements (306, 308, 406). The bonding may be performed by using a transient liquid phase (TLP) bonding technique on the bonding elements. As discussed above, the first substrate (302) and second substrate (402) may expand and contract at different rates during the step of bonding (106). However, as the second substrate (402), which typically comprises a material having a higher CTE than that of the first substrate (302), has a reduced rigidity due to the indentations (404) on the first side, stress and/or strain induced by the CTE mismatch between the first and second substrates (302, 402) can be better accommodated. For example, when the substrate 402 without the indentations 404 is heated, the substrate 402 can expand at the water level, but when the substrate 402 with the indentations 404 is heated, the expansion can occur at the chip level. This can be significant as a typical wafer size can be significantly larger than a chip size. For example, the wafer size can be 100 mm to 300 mm and the chip size can be less than 3 mm, less than 2 mm or less than 1 mm. Thus, including the indentations 404 may result in reduced risk of structural damage to the first and second substrates (302, 402) and the components formed thereon. In some embodiments, the CTE of the second substrate 402 can be at least 1.5 times, 2 times, or 3 times the CTE of the first substrate 302.

The first and second substrates 302, 402 can be bonded to one another bay way of the bonding elements 306, 308, 406. In some embodiments, the first substrate 302, the second substrate 402, and the bonding elements 306, 308, 406 can define a hermetic cavity. The hermetic cavity can be filled with gas (e.g., air). The hermetic cavity can beneficially contribute to maintaining performance of the resonators of the first and second acoustic wave devices as the hermetic seal can prevent or mitigate unwanted gas or moisture from entering the hermetic cavity. As described herein, the bonding element 306 can have a plated metal (e.g., copper (Cu)).

Therefore, in some embodiments, the inner surfaces of the hermetic cavity can consist of inorganic materials.

After the step of bonding (106) the first substrate (302) and second substrate (402), the thickness of the second substrate (402) may be reduced by grinding from the second side of the second substrate (402). When the first side of the second substrate (402) comprises the indentations (404), the thickness of the second substrate (402) may be reduced until each of the resonator components of the second type is singulated as defined by the indentations (404). For example, as shown in FIGS. 5A and 5B each of the SAW resonators on the second substrate (402) may be singulated as defined by the indentation (404). In such cases, each of the resonator components of the second type are separated by full-cuts (504) as shown in FIGS. 5A and 5B. Each of the singulated resonator components of the second type may be aligned to approximately overlap with one of the resonator components of the first type (304A) on the first substrate (302). The singulated resonator components of the second type may be mounted on a removable support wafer (502). The support wafer (502) may comprise an adhesive layer (503) on which the singulated resonator components of the second type may be mounted.

Alternatively, the second substrate (402) may not be singulated after the step of bonding (106). In such cases, the second substrate (402) may be mounted on a removable support wafer (502). The support wafer (502) may comprise an adhesive layer (503) on which the singulated resonator components of the second type may be mounted. Each of the resonator components of the second type may be aligned to approximately overlap with one of the resonator components of the first type (304A) on the first substrate (302).

Similarly, the thickness of the first substrate (302) may optionally be reduced by grinding from the second side of the first substrate (302). Reducing the thickness of the first substrate may be advantageous for forming vias through the first substrate (302).

After the step of bonding (106) the first substrate (302) and second substrate (402), at least one via (506) may be formed through the first substrate (302). The via(s) (506) may be in the form of through-silicon vias (TSVs), as shown in FIGS. 5A and 5B. The via 506 can include a filled via or a conformal via. Each of the vias (506) may comprise a first conductive material on the second surface of the first substrate to form a conductive layer on the surface of the vias (506) and, optionally, on the second surface of the first substrate (302). The first conductive material may be deposited on the surface of the vias (506) to form at least one via (506) filled with the first conductive material. Optionally, a second conductive material (508) may also be deposited adjacent to the conductive layer to form a plurality of conductive members electrically connected to the conductive layer on the surface of the vias.

After the step of bonding (106), the first substrate (302), the second substrate (402), and the components formed thereon may be diced (114) in order to singulate the bonded first substrate and second substrate (500) into at least one individual combined package (600). The dicing (114) may be performed by any suitable dicing technique, such as blade dicing, laser ablation and stealth dicing techniques. Optionally, prior to the dicing (114), at least one of the first substrate (302) and second substrate (402) may be mounted on a suspension mechanism (602). The suspension mechanism (602) may be a removable suspension mechanism such as a dicing tape.

Figure 6C:
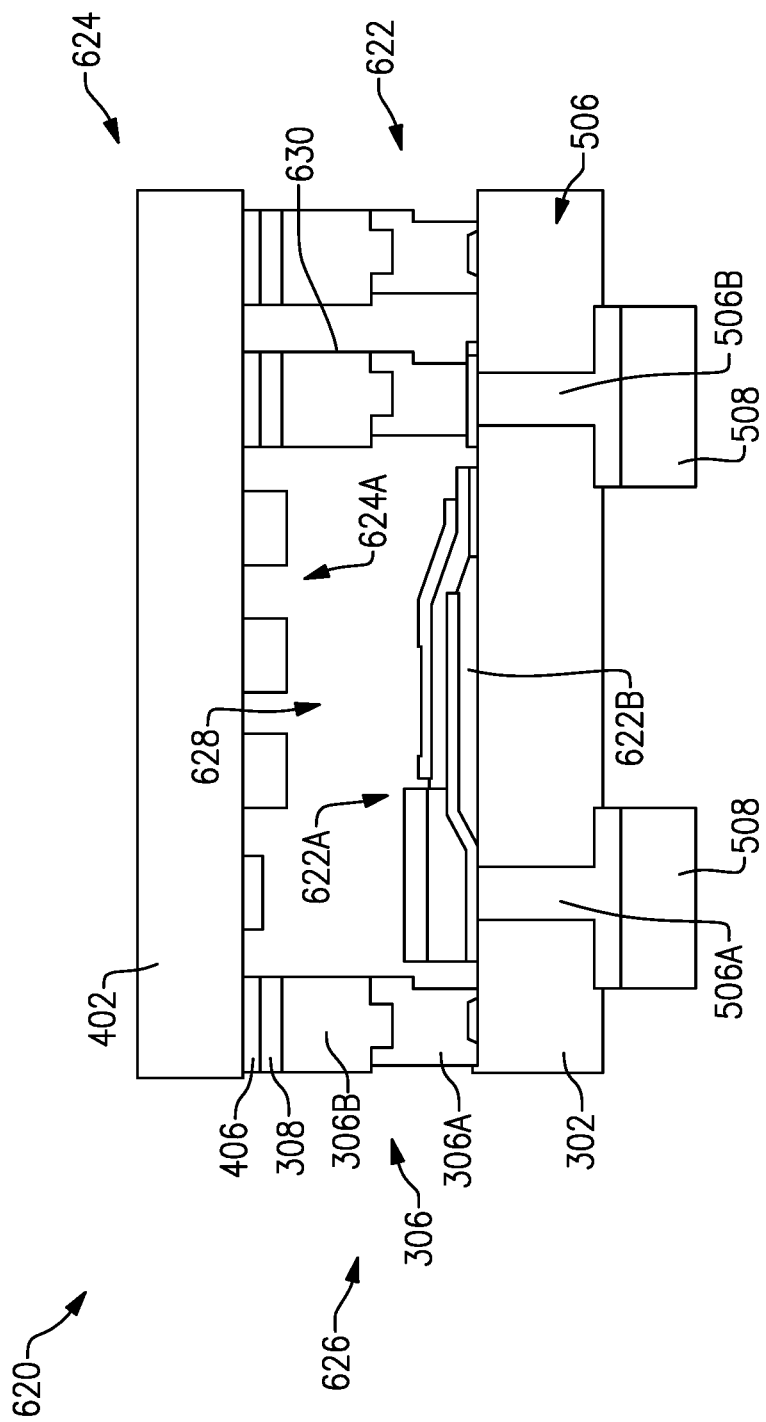
FIG. 6C is a schematic cross sectional side vice of a stacked structure according to an embodiment.

FIG. 6C is a schematic cross sectional side view of a stacked structure 620 (e.g., stacked filter package) according to an embodiment. Unless otherwise noted, components of the stacked structure 620 in FIG. 6C can be the same as or similar to like components disclosed herein. In some embodiments, the stacked structure 620 can represent the individual combined package 600 shown in FIG. 6B. The stacked structure 620 can include a first acoustic wave device 622 and a second acoustic wave device 624 stacked and bonded to one another by way of a bonding structure 626. The stacked structure 620 can include a cavity 628. In some embodiments, the cavity 628 can be a hermetic cavity.

The first acoustic wave device 622 can be a BAW device having BAW components 622a over a first substrate 302. The first substrate 302 can include vias 506 formed therein. For example, the first substrate 302 can be a silicon substrate and the vias 506 can be through-silicon vias (TSVs). The BAW components 622a can be electrically coupled to a via 506a and a pad 508. The BAW components 622a can be electrically coupled to an external system or substrate (e.g., a system board) (now shown) at least partially through the via 506a and the pad 508.

The first acoustic wave device 622 can include an air cavity 622b. Electrodes of the BAW components 622a can be susceptible moisture. For example, under a relatively high humidity, water can be present on the electrodes of the BAW components 622a which can degrade the performance of the acoustic wave device 622. Therefore, having the hermetic cavity as the cavity 628 can be beneficial to maintain the condition (e.g., humidity) of the cavity 628 for reliable operation of the first acoustic wave device 622.

The second acoustic wave device 624 can be a SAW device having SAW components 624a and a second substrate 402. The second substrate 402 can be a piezoelectric substrate, such as a lithium tantalate substrate or a lithium niobate substrate. The SAW components 624a can include an interdigital transducer (IDT) electrodes. The SAW components 624a can be electrically coupled to a via 506b formed with the first substrate 302 and the contact pad 508. The SAW components 624a can be electrically coupled to a via 506b by way of a post or pillar 630 formed in the cavity 628. In some embodiments, the pillar 630 can provide input/output (I/O) communication for the SAW components 624a.

Forming a via in a silicon substrate can be easier, more cost effective, and quicker than forming a via in a piezoelectric layer. For example, an etch rate of silicon can be higher than an etch rate of a piezoelectric material under the same condition. Therefore, forming the vias in the first substrate 302 as disclosed herein can be easier than forming vias in the second substrate 402. The combination of the via 506b and the pillar 630 can beneficially reduce footprint of the bonded structure 620 as compared to a structure with electrical rounding outside of the cavity 628. Therefore, various embodiments disclosed herein can reduce real estate waste of a wafer that is used for forming the second acoustic wave device 624.

The bonding structure 626 can include bonding elements 306, 308, 406. The bonding element 306 can include a first portion 306a and a second portion 306b. A width of the first portion 306a and a width of the second portion 306b can be different. In some embodiments, the width of the first portion can be narrower than the width of the second portion 306b. In some other embodiments, the width of the first portion can be wider than the width of the second portion 306b. In some embodiments, the bonding structure 626 can provide ground connection for the SAW components 624a.

In some embodiments, an average width of the bonding structure 626 can be about 25 μm. For example, the average width of the bonding structure 626 can be in a range of 15 µm to 35 µm, 20 µm to 35 µm, or 20 µm to 30 µm. In some embodiments, a width of the pillar 630 can be about 40 µm. for example, the width of the pillar can be in a range of 30 µm to 50 µm, 35 µm to 50 µm, 35 µm to 45 µm. In some embodiments, a width of the via 506 can be about 30 µm. For example, the width of the via 506 can be in a range of 20 µm to 40 µm, 25 µm to 40 µm, or 25 µm to 35.

Figure 7:
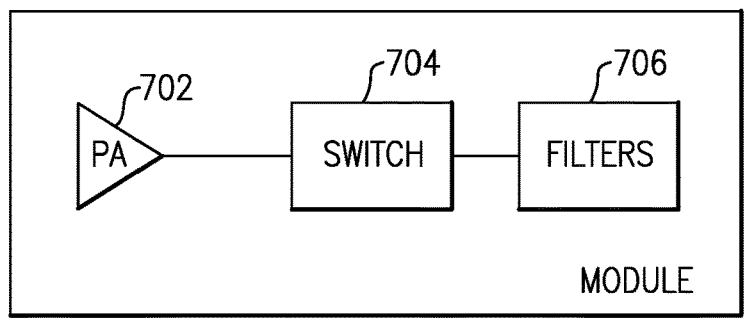
FIG. 7 is a schematic block diagram of a module that comprises a power amplifier, a switch, and filters.

FIG. 7 is a schematic block diagram of a module (700) that includes a power amplifier (702), a switch (704), and filters (706) in accordance with one or more embodiments. The module (700) can include a package that encloses the illustrated elements. The power amplifier (702), the switch (704), and the filters (706) can be disposed on a common packaging substrate. The packaging substrate can be a laminate substrate, for example. The power amplifier (702) can amplify a radio frequency signal. The power amplifier (702) can include a gallium arsenide bipolar transistor in certain applications. The switch (704) can be a multi-throw radio frequency switch. The switch (704) can electrically couple an output of the power amplifier (702) to a selected filter of the filters (706). The filters (706) can include any suitable number of the combined package (600) having any suitable number of surface acoustic wave filters, bulk acoustic wave filters, and/or other acoustic wave filters. One or more of the combined packages (600) of the filters (706) can be implemented in accordance with any suitable principles and advantages of the combined package (600) discussed herein.

Figure 8:
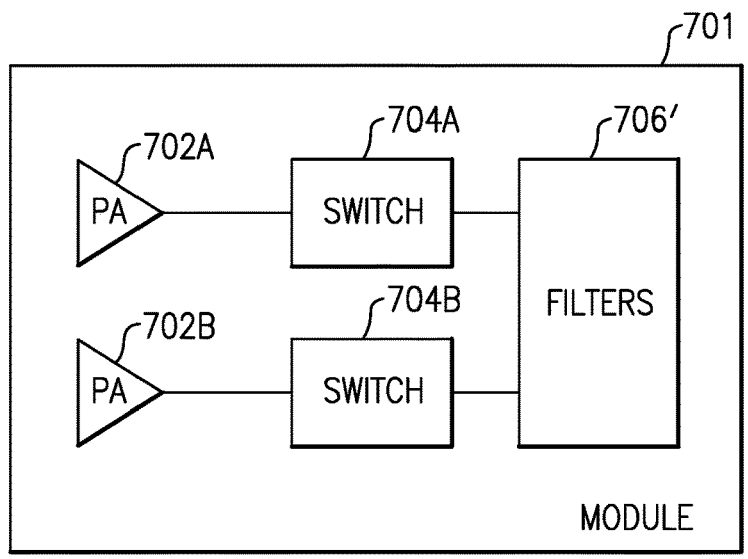
FIG. 8 is a schematic block diagram of a module that comprises power amplifiers, switches, and filters.

FIG. 8 is a schematic block diagram of a module (701) that includes power amplifiers (702A) and (702B), switches (704A) and (704B), and filters (706)' in accordance with one or more embodiments. The module (701) is like the module (700) of FIG. 7, except that the module (701) includes an additional power amplifier (702B) and an additional switch (704B) and the filters (706)' are arranged to filter signals for the signals paths associated with a plurality of power amplifiers (702A) and (702B). The different signal paths can be associated with different frequency bands and/or different modes of operation (e.g., different power modes, different signaling modes, etc.).

Figure 9:
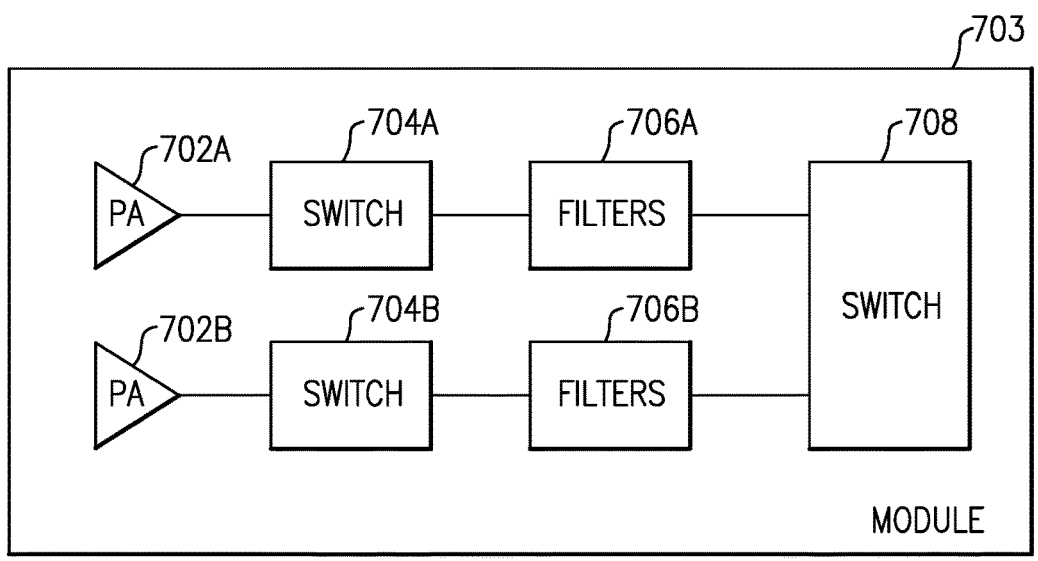
FIG. 9 is a schematic block diagram of a module that comprises power amplifiers, switches, filters, and an antenna switch.

FIG. 9 is a schematic block diagram of a module (703) that includes power amplifiers (702A) and (702B), switches (704A) and (704B), and filters (706A) and (706B) in accordance with one or more embodiments, and an antenna switch (708). The module (703) is like the module (701) of FIG. 8, except the module (703) includes an antenna switch (708) arranged to selectively couple a signal from the filters (706A) or the filters (706B) to an antenna node. The filters (706A) and (706B) can correspond to the filters (706)' of FIG. 8.

Figure 10:
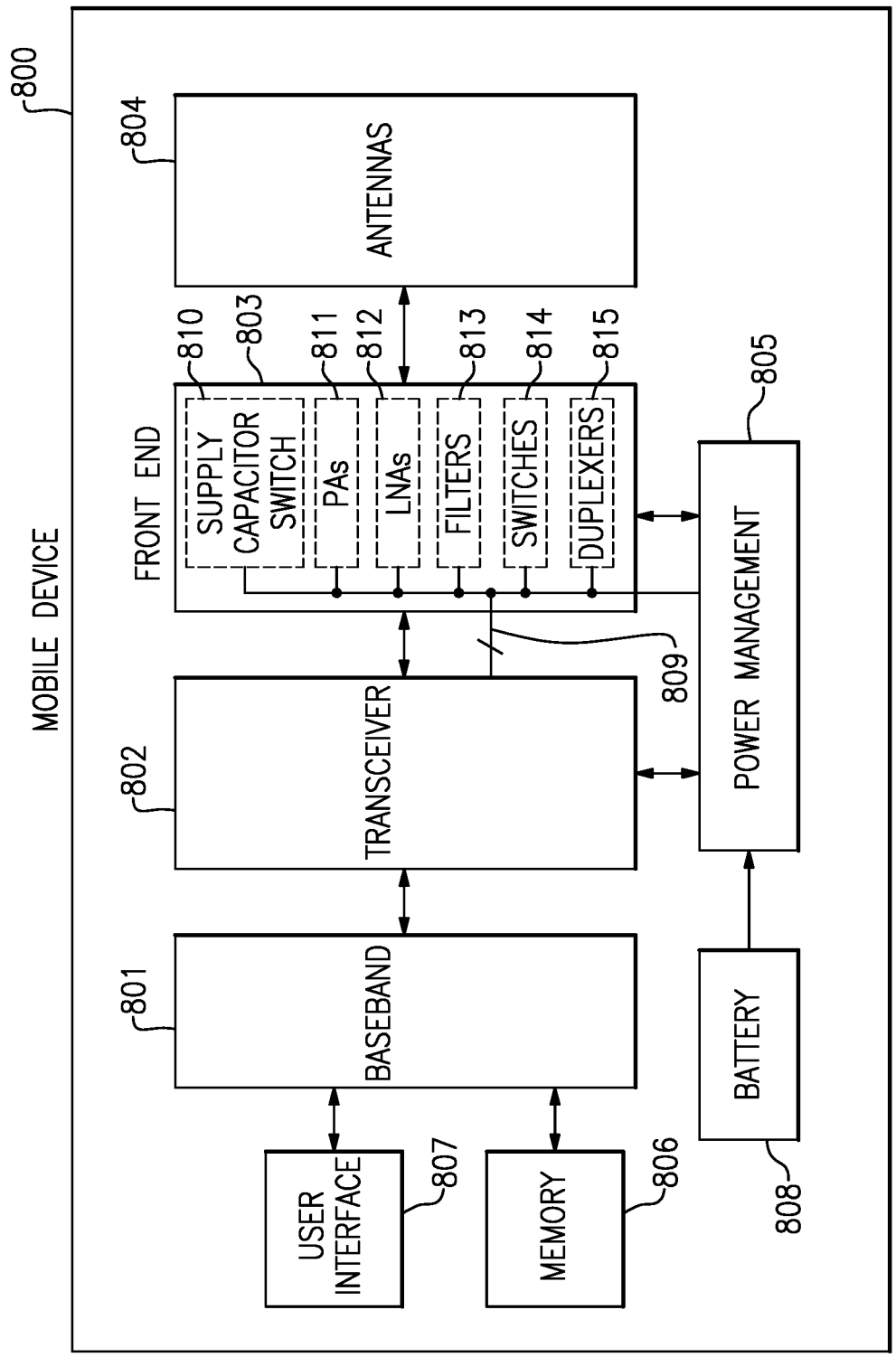
FIG. 10 is a schematic diagram of one embodiment of a wireless communication device.

FIG. 10 is a schematic diagram of one embodiment of a wireless communication device or mobile device (800). The mobile device (800) includes a baseband system (801), a transceiver (802), a front end system (803), antennas (804), a power management system (805), a memory (806), a user interface (807), and a battery (808).

Although the mobile device (800) illustrates one example of an RF system that can include one or more features of the present disclosure, the teachings herein are applicable to electronic systems implemented in a wide variety of ways.

The mobile device (800) can be used to communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver (802) generates RF signals for transmission and processes incoming RF signals received from the antennas (804). It will be understood that various functionalities associated with the transmission and receiving of RF signals can be achieved by one or more components that are collectively represented in FIG. 10 as the transceiver (802). In one example, separate components (for instance, separate circuits or dies) can be provided for handling certain types of RF signals.

As shown in in FIG. 10, the transceiver (802) is connected to the front end system (803) and to the power management circuit (805) using a serial interface (809). All or part of the illustrated RF components can be controlled by the serial interface (809) to configure the mobile device (800) during initialization and/or while fully operational. In another embodiment, the baseband processor (801) is additionally or alternative connected to the serial interface (809) and operates to configure one or more RF components, such as components of the front end system (803) and/or power management system (805).

The front end system (803) aids in conditioning signals transmitted to and/or received from the antennas (804). In the illustrated embodiment, the front end system (803) includes one or more bias control circuits (810) for controlling power amplifier biasing, one or more power amplifiers (PAs) (811), one or more low noise amplifiers (LNAs) (812), one or more filters (813), one or more switches (814), and one or more duplexers (815). However, other implementations are possible.

For example, the front end system (803) can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device (800) supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas (804) can include antennas used for a wide variety of types of communications. For example, the antennas (804) can include antennas for transmitting and/or receiving signals associated with a wide variety of frequencies and communications standards.

In certain implementations, the antennas (804) support multiple-input and multiple-output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device (800) can operate with beamforming in certain implementations. For example, the front end system (803) can include phase shifters having variable phase controlled by the transceiver (802). Additionally, the phase shifters are controlled to provide beam formation and directivity for transmission and/or reception of signals using the antennas (804). For example, in the context of signal transmission, the phases of the transmit signals provided to the antennas (804) are controlled such that radiated signals from the antennas (804) combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas (804) from a particular direction. In certain implementations, the antennas (804) include one or more arrays of antenna elements to enhance beamforming.

The baseband system (801) is coupled to the user interface (807) to facilitate processing of various user input and output (I/O), such as voice and data. The baseband system (801) provides the transceiver (802) with digital representations of transmit signals, which the transceiver (802) processes to generate RF signals for transmission. The baseband system (801) also processes digital representations of received signals provided by the transceiver (802). As shown in FIG. 10, the baseband system (801) is coupled to the memory (806) to facilitate operation of the mobile device (800).

The memory (806) can be used for a wide variety of purposes, such as storing data and/or instructions to facilitate the operation of the mobile device (800) and/or to provide storage of user information.

The power management system (805) provides a number of power management functions of the mobile device (800). In certain implementations, the power management system (805) includes a power amplifier (PA) supply control circuit that controls the supply voltages of the power amplifiers (811). For example, the power management system (805) can be configured to change the supply voltage(s) provided to one or more of the power amplifiers (811) to improve efficiency, such as power added efficiency (PAE).

The power management system (805) can operate in a selectable supply control mode, such an average power tracking (APT) mode or an envelope tracking (ET) mode. In the illustrated embodiment, the selected supply control mode of the power management system (805) is controlled by the transceiver (802). In certain implementations, the transceiver (802) controls the selected supply control mode using the serial interface (809).

As shown in FIG. 10, the power management system (805) receives a battery voltage from the battery (808). The battery (808) can be any suitable battery for use in the mobile device (800), including, for example, a lithium-ion battery. Although the power management system (805) is illustrated as separate from the front end system (803), in certain implementations all or part (for instance, a PA supply control circuit) of the power management system (805) is integrated into the front end system (803).

Figure 11:
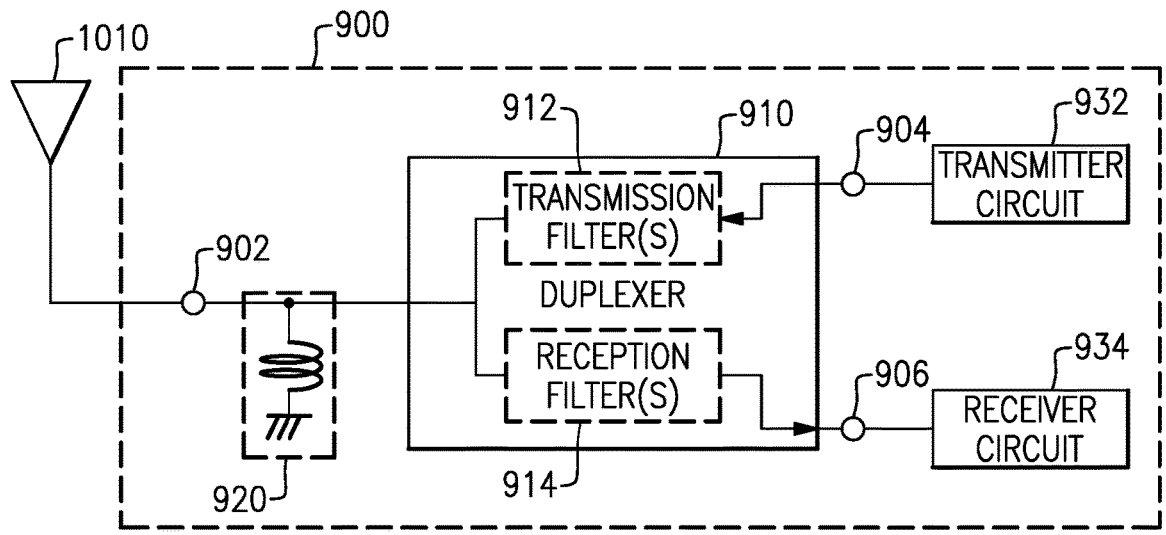
FIG. 11 is a block diagram of one embodiment of a front-end module that can comprises one or more filter modules comprising the combined acoustic wave device package.

Referring to FIG. 11, there is illustrated a block diagram of one example of a front-end module (900), which may be used in an electronic device such as a wireless communications device (e.g., a mobile phone) for example. The front-end module (900) includes an antenna duplexer (910) having a common node (902), an input node (904), and an output node (906). An antenna (1010) is connected to the common node (902).

The antenna duplexer (910) may include one or more transmission filters (912) connected between the input node (904) and the common node (902), and one or more reception filters (914) connected between the common node (902) and the output node (906). The passband(s) of the transmission filter(s) are different from the passband(s) of the reception filters. Examples of the SAW filter (800) can be used to form the transmission filter(s) (912) and/or the reception filter(s) (914). An inductor or other matching component (920) may be connected at the common node (902).

The front-end module (900) further includes a transmitter circuit (932) connected to the input node (904) of the duplexer (910) and a receiver circuit (934) connected to the output node (906) of the duplexer (910). The transmitter circuit (932) can generate signals for transmission via the antenna (1010), and the receiver circuit (934) can receive and process signals received via the antenna (1010). Optionally, the receiver and transmitter circuits are implemented as separate components, as shown in FIG. 11, however, these components may optionally be integrated into a common transceiver circuit or module. As will be appreciated by those skilled in the art, the front-end module (900) may include other components that are not illustrated in FIG. 11 including, but not limited to, switches, electromagnetic couplers, amplifiers, processors, and the like.

Figure 12:
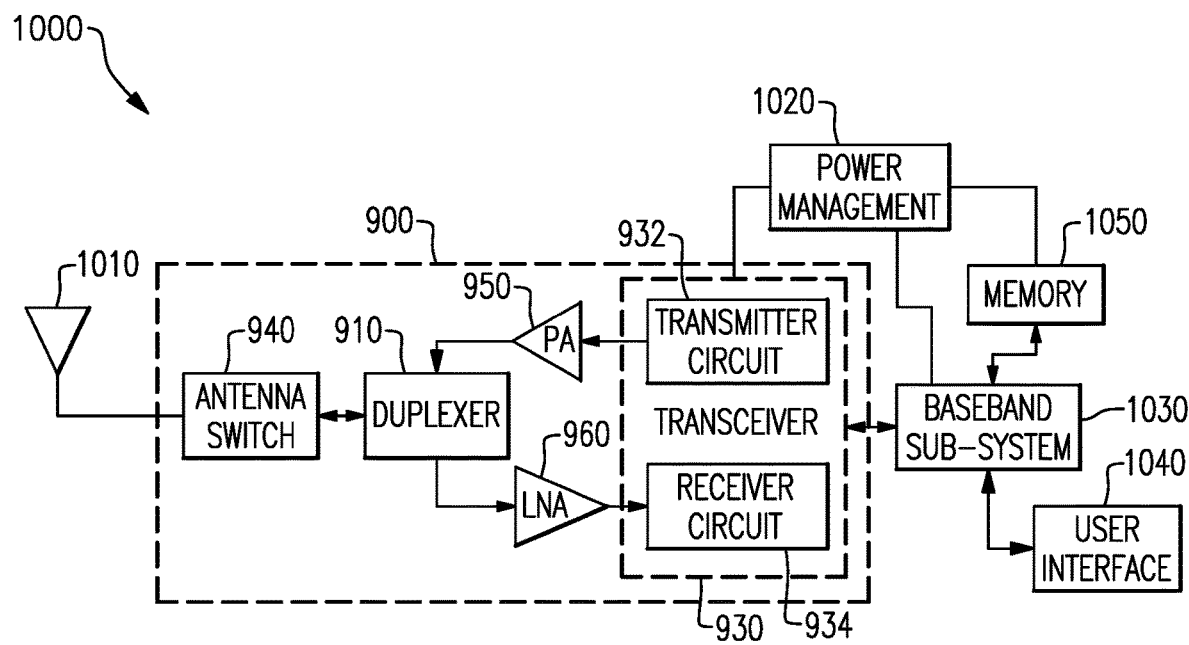
FIG. 12 is a block diagram of one embodiment of a wireless device comprising the front-end module.

FIG. 12 is a block diagram of one example of a wireless device (1000) including the antenna duplexer (910) shown in FIG. 11. The wireless device (1000) can be a cellular phone, smart phone, tablet, modem, communication network or any other portable or non-portable device configured for voice or data communication. The wireless device (1000) can receive and transmit signals from the antenna (1010). The wireless device includes an embodiment of a front-end module (900) similar to that discussed above with reference to FIG. 11. The front-end module (900) includes the duplexer (910), as discussed above. In the example shown in FIG. 11 the front-end module (900) further includes an antenna switch (940), which can be configured to switch between different frequency bands or modes, such as transmit and receive modes, for example. In the example illustrated in FIG. 11, the antenna switch (940) is positioned between the duplexer (910) and the antenna (1010); however, in other examples the duplexer (910) can be positioned between the antenna switch (940) and the antenna (1010). In other examples the antenna switch (940) and the duplexer (910) can be integrated into a single component.

The front-end module (900) includes a transceiver (930) that is configured to generate signals for transmission or to process received signals. The transceiver (930) can include the transmitter circuit (932), which can be connected to the input node (904) of the duplexer (910), and the receiver circuit (934), which can be connected to the output node (906) of the duplexer (910), as shown in the example of FIG. 11.

Signals generated for transmission by the transmitter circuit (932) are received by a power amplifier (PA) module (950), which amplifies the generated signals from the transceiver (930). The power amplifier module (950) can include one or more power amplifiers. The power amplifier module (950) can be used to amplify a wide variety of RF or other frequency-band transmission signals. For example, the power amplifier module (950) can receive an enable signal that can be used to pulse the output of the power amplifier to aid in transmitting a wireless local area network (WLAN)

signal or any other suitable pulsed signal. The power amplifier module (950) can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module (950) and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 11, the front-end module (900) may further include a low noise amplifier (LNA) module (960), which amplifies received signals from the antenna (1010) and provides the amplified signals to the receiver circuit (934) of the transceiver (930).

The wireless device (1000) of FIG. 12 further includes a power management sub-system (1020) that is connected to the transceiver (930) and manages the power for the operation of the wireless device (1000). The power management system (1020) can also control the operation of a baseband sub-system (1030) and various other components of the wireless device (1000). The power management system (1020) can include, or can be connected to, a battery (not shown) that supplies power for the various components of the wireless device (1000). The power management system (1020) can further include one or more processors or controllers that can control the transmission of signals, for example. In one embodiment, the baseband sub-system (1030) is connected to a user interface (1040) to facilitate various input and output of voice and/or data provided to and received from the user. The baseband sub-system (1030) can also be connected to memory (1050) that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 500 MHz to 3 GHz.

Further examples of the electronic devices that aspects of this disclosure may be implemented include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A stacked filter package comprising:
   a first acoustic wave device having a first device type, the first acoustic wave device including a first substrate having an isotropic thermal expansion characteristic and a first coefficient of thermal expansion;
   a second acoustic wave device having a second device type different from the first device type, the second acoustic wave device including a second substrate having an anisotropic thermal expansion characteristic and a second coefficient of thermal expansion, the second coefficient of thermal expansion being at least double the first coefficient of thermal expansion; and
   a bonding structure between the first and second substrates, the bonding structure coupling the first and second substrates.

2. The stacked filter package of claim 1 wherein the first acoustic wave device is a bulk acoustic wave filter and the second acoustic wave device is a surface acoustic wave filter.

3. The stacked filter package of claim 2 wherein the bulk acoustic wave filter includes a film bulk acoustic wave resonator.

4. The stacked filter package of claim 1 wherein the second substrate is a lithium tantalate substrate or a lithium niobate substrate.

5. The stacked filter package of claim 1 further comprising at least one metal layer that covers at least a part of one side of the first substrate.

6. The stacked filter package of claim 1 wherein the first substrate includes a first through via electrically connected to the first acoustic wave device and a second through via electrically connected to the second acoustic wave device.

7. The stacked filter package of claim 6 further comprising a pillar, the second acoustic wave device electrically connected to the second through via at least partially through the pillar.

8. The stacked filter package of claim 1 wherein the first substrate, the second substrate, and the bonding structure together define a hermetic cavity.

9. The stacked filter package of claim 8 wherein inner surfaces of the hermetic cavity consist of inorganic materials.

10. The stacked filter package of claim 8 wherein an inner sidewall of the bonding structure that faces the hermetic cavity is metal plated.

11. A stacked filter package comprising:
    a bulk acoustic wave device including a first substrate that has an isotropic thermal expansion characteristic; and
    a surface acoustic wave device stacked over the bulk acoustic wave device such that a second substrate of the surface acoustic wave device is coupled to the first substrate by way of a bonding structure, and the second substrate has an anisotropic thermal expansion characteristic.

12. The stacked filter package of claim 11 wherein the first substrate is a silicon substrate.

13. The stacked filter package of claim 12 wherein the second substrate is a lithium tantalate substrate or a lithium niobate substrate.

14. The stacked filter package of claim 11 wherein the first substrate includes a first through via electrically connected to the bulk acoustic wave device and a second through via electrically connected to the surface acoustic wave device at least partially through a pillar.

15. A stacked filter package comprising:
a first acoustic wave device having a first device type with a first filter including a first substrate having an isotropic thermal expansion characteristic;
a second acoustic wave device having a second device type different from the first device type with a second filter including a second substrate having an anisotropic thermal expansion characteristic; and
a hermetic cavity between the first substrate and the second substrate.

16. The stacked filter package of claim 15 wherein the first acoustic wave device is a bulk acoustic wave filter and the second acoustic wave device is a surface acoustic wave filter.

17. The stacked filter package of claim 16 wherein the bulk acoustic wave filter includes a film bulk acoustic wave resonator.

18. The stacked filter package of claim 15 wherein the second substrate is a lithium tantalate substrate or a lithium niobate substrate.

19. The stacked filter package of claim 15 further comprising a bonding structure between the first and second substrates, the first substrate, second substrate, and the bonding structure together define the hermetic cavity.

20. The stacked filter package of claim 19 wherein inner surfaces of the hermetic cavity consist of inorganic materials.

* * * * *